United States Patent
Lee et al.

(10) Patent No.: US 7,648,849 B2
(45) Date of Patent: Jan. 19, 2010

(54) NITRIDE SEMICONDUCTOR LIGHT EMITTING DIODE HAVING MESH DBR REFLECTING LAYER

(75) Inventors: Jae Hoon Lee, Kyungki-Do (KR); In Eung Kim, Kyungki-Do (KR); Yong Chun Kim, Kyungki-Do (KR); Hyun Kyung Kim, Kyungki-Do (KR); Moon Heon Kong, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 194 days.

(21) Appl. No.: 11/933,950

(22) Filed: Nov. 1, 2007

(65) Prior Publication Data

US 2008/0064133 A1 Mar. 13, 2008

Related U.S. Application Data

(62) Division of application No. 11/064,968, filed on Feb. 25, 2005, now abandoned.

(30) Foreign Application Priority Data

Aug. 11, 2004 (KR) .......................... 10-2004-63214

(51) Int. Cl.
*H01L 21/00* (2006.01)
(52) U.S. Cl. .............................. 438/22; 438/29; 257/79; 257/98; 257/103; 257/E33.001; 257/E33.028; 257/E33.068; 257/E33.069; 257/E33.099
(58) Field of Classification Search .................. 438/22; 257/79, 98, 103, E33.028, E33.068, E33.001, 257/E33.069, E33.099
See application file for complete search history.

(56) References Cited

U.S. PATENT DOCUMENTS

| 6,408,015 | B1 | 6/2002 | Kaneko |
| 6,486,044 | B2 | 11/2002 | Kordesch |
| 6,573,537 | B1 | 6/2003 | Steigerwald |
| 2004/0227144 | A1* | 11/2004 | Hon ............................ 257/87 |
| 2005/0247950 | A1 | 11/2005 | Nakamura et al. |
| 2006/0049411 | A1* | 3/2006 | Nakamura et al. ............ 257/79 |
| 2006/0208273 | A1 | 9/2006 | Kang |

FOREIGN PATENT DOCUMENTS

| JP | 2000-91701 A | 3/2000 |
| JP | 2002-335014 A | 11/2002 |
| JP | 2004-071655 A | 3/2004 |

OTHER PUBLICATIONS

Japanese Patent Office, Office Action mailed Dec. 18, 2007 and English Translation.
Webster's II New Riverside University Dictionary, Houghton Mifflin co., Copyright 1994, p. 744.

* cited by examiner

*Primary Examiner*—Long K Tran
(74) *Attorney, Agent, or Firm*—Lowe Hauptman Ham & Berner

(57) ABSTRACT

A flip chip-type nitride semiconductor light emitting diode includes a light transmittance substrate, an n-type nitride semiconductor layer, an active layer, a p-type nitride semiconductor layer and a mesh-type DBR reflecting layer. The mesh-type DBR reflecting layer has a plurality of open regions. The mesh-type DBR reflecting layer is composed of first and second nitride layers having different Al content. The first and second nitride layers are alternately stacked several times to form the mesh-type DBR reflecting layer. An ohmic contact layer is formed on the mesh-type DBR reflecting layer and on the p-type nitride semiconductor layer.

9 Claims, 4 Drawing Sheets

NITRIDE SEMICONDUCTOR LIGHT EMITTING DIODE HAVING MESH DBR REFLECTING LAYER

RELATED APPLICATION

The present application is a division of U.S. application Ser. No. 11/064,968, filed Feb. 25, 2005 which is based on, and claims priority from, Korean Application No. 2004-63214, filed on Aug. 11, 2004, the disclosures of which are hereby incorporated by reference herein in their entirety.

BACKGROUND OF THE INVENTION

1. Field of the Invention

The present invention relates to a nitride semiconductor light emitting diode, and more particularly to a nitride semiconductor light emitting diode that adopts a flip chip structure. Also, the present invention relates to a method of manufacturing the same.

2. Description of the Related Art

Generally, a nitride semiconductor light emitting diode is a light emitting diode used to obtain light having a blue or green wavelength band. The nitride semiconductor light emitting diode is made of a nitride semiconductor material having the following formula:

Where, $0 \leq x \leq 1$, $0 \leq y \leq 1$, and $0 \leq x+y \leq 1$

A substrate used to grow such a nitride semiconductor material is limited to a sapphire substrate because of lattice matching. The sapphire substrate is an insulated substrate, and thus both electrodes of the nitride semiconductor light emitting diode are formed at the opposite side of the sapphire substrate, i.e., a crystal growth surface. Considering the above-mentioned structural characteristics, there has been briskly developed a nitride semiconductor light emitting diode adopting a flip chip structure where the sapphire substrate is provided with a main light emitting surface.

FIG. 1 shows a flip chip structure of a conventional flip chip-type nitride light emitting diode.

A flip chip-type light emitting device 20 shown in FIG. 1 comprises a nitride semiconductor light emitting diode 10 mounted on a chip substrate 21. The nitride semiconductor light emitting diode 10 comprises a sapphire substrate 11, an n-type nitride semiconductor layer 12 disposed on the sapphire substrate 11, an active layer 13 disposed on the n-type nitride semiconductor layer 12, and a p-type nitride semiconductor layer 14 disposed on the active layer 13. The nitride semiconductor light emitting diode 10 is mounted on the chip substrate such that electrodes 19a and 19b are connected to lead patterns 22a and 22b via conductive bumps 24a and 24b, respectively. The sapphire substrate 11 of the light emitting diode 10 is a light transmittance substrate. Consequently, the sapphire substrate 11 may be used as a light emitting surface of the flip chip-type light emitting device 20.

It is required that the electrodes of the nitride semiconductor light emitting diode 10, especially, the p-side electrode form ohmic contact with the p-type nitride semiconductor layer 14, and have high reflexibility sufficient to reflect light emitted from the active layer 13 to the sapphire substrate 11.

As shown in FIG. 1, therefore, the p-side electrode structure may include an ohmic contact layer 16 and a metal barrier layer 17 formed on the p-type nitride semiconductor layer 14. The ohmic contact layer 16 is made of Ag or Al having high reflexibility of approximately 90% to 95% so that the ohmic contact layer 16 can improve contact resistance. The metal barrier layer 17 serves to prevent undesired immigration of components of the ohmic contact layer 16.

However, the metal, such as Ag or Al, forming the ohmic contact layer 16 is very sensitive to heat. As a result, the reflexibility of the ohmic contact layer 16 is lowered to approximately 60%-80%. If the reflexibility of the ohmic contact layer 16 is lowered, brightness of the flip chip-type light emitting device 20 is also lowered.

Also, the conventional nitride semiconductor light emitting diode 10 substantially has a planner electrode structure. Specifically, the p-side ohmic contact layer 16 has specific resistance lower than that of the p-type nitride semiconductor layer 14. As a result, a large portion of electric current is concentrated to a part A adjacent to the n-side electrode as indicated by the arrow. In other words, current crowding occurs. When the current crowding occurs, forward voltage is increased, light emitting efficiency of the active layer 13 disposed opposite to the n-side electrode 19a is decreased, and heat value of the part A where the electric current is concentrated is increased, whereby reliability of the nitride semiconductor light emitting diode is considerably deteriorated.

SUMMARY OF THE INVENTION

Therefore, the present invention has been made in view of the above problems, and it is an object of the present invention to provide a nitride semiconductor light emitting diode having an improved p-side electrode structure, thereby improving current diffusion effects and reflexibility.

It is another object of the present invention to provide a method of manufacturing such a nitride semiconductor light emitting diode.

In accordance with one aspect of the present invention, the above and other objects can be accomplished by the provision of a nitride semiconductor light emitting diode comprising: a light transmittance substrate that allows a nitride semiconductor to be grown thereon; an n-type nitride semiconductor layer formed on the light transmittance substrate; an active layer formed on the n-type nitride semiconductor layer; a p-type nitride semiconductor layer formed on the active layer; a mesh-type DBR reflecting layer formed on the p-type nitride semiconductor layer, the mesh-type (Distributed Bragg) DBR reflecting layer having a plurality of open regions, the mesh-type DBR reflecting layer being composed of first and second nitride layers having different Al content, the first and second nitride layers being alternately stacked several times to form the mesh-type DBR reflecting layer; and an ohmic contact layer formed on the mesh-type DBR reflecting layer and on the p-type nitride semiconductor layer exposed through the open regions of the mesh-type DBR reflecting layer.

Preferably, difference of the Al content between the first and second nitride layers constituting the mesh-type DBR reflecting layer is at least 30% to sufficiently ensure difference between the refractive indices of the first and second nitride layers.

The first and second nitride layers constituting the mesh-type DBR reflecting layer may be formed of materials satisfying the following formula: $Al_{1-x}Ga_xN$ ($0 \leq x \leq 1$). Preferably, the first nitride layer is made of AlGaN, and the second nitride layer is made of GaN.

Preferably, the effective area of the mesh-type DBR reflecting layer is approximately 20% to 60% of the upper surface area of the p-type nitride semiconductor layer.

The ohmic contact layer comprises at least one layer made of a material selected from the group consisting of Ag, Ni, Al, Ph, Pd, Ir, Ru, Mg, Zn, Pt, Au, and composites thereof. In a specific embodiment of the present invention, the nitride semiconductor light emitting diode further comprises: a metal barrier layer formed on the surface of the ohmic contact layer. The metal barrier layer is made of a material selected from the group consisting of Ni, Al, Cu, Cr, Ti, and composites thereof.

In accordance with another aspect of the present invention, there is provided a method of manufacturing a nitride semiconductor light emitting diode, the method comprising the steps of: preparing a light transmittance substrate that allows a nitride semiconductor to be grown thereon; forming an n-type nitride semiconductor layer on the light transmittance substrate; forming an active layer on the n-type nitride semiconductor layer; forming a p-type nitride semiconductor layer on the active layer; alternately stacking first and second nitride layers having different Al content on the p-type nitride semiconductor layer several times to form a mesh-type DBR reflecting layer having a plurality of open regions; and forming an ohmic contact layer on the mesh-type DBR reflecting layer and on the p-type nitride semiconductor layer exposed through the open regions of the mesh-type DBR reflecting layer.

Preferably, the step of forming the n-type nitride semiconductor layer, the step of forming the active layer, the step of forming the p-type nitride semiconductor layer, and the step of forming the mesh-type DBR reflecting layer are carried out successively in the same chamber.

In a specific embodiment of the present invention, the step of forming the mesh-type DBR reflecting layer is carried out at a temperature of 500° C. to 700° C. to prevent occurrence of cracks.

The term "a flip chip-type light emitting device" used in the present invention indicates a light emitting device having a light emitting diode mounted on a chip substrate in a flip chip structure, as shown in FIG. 1.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
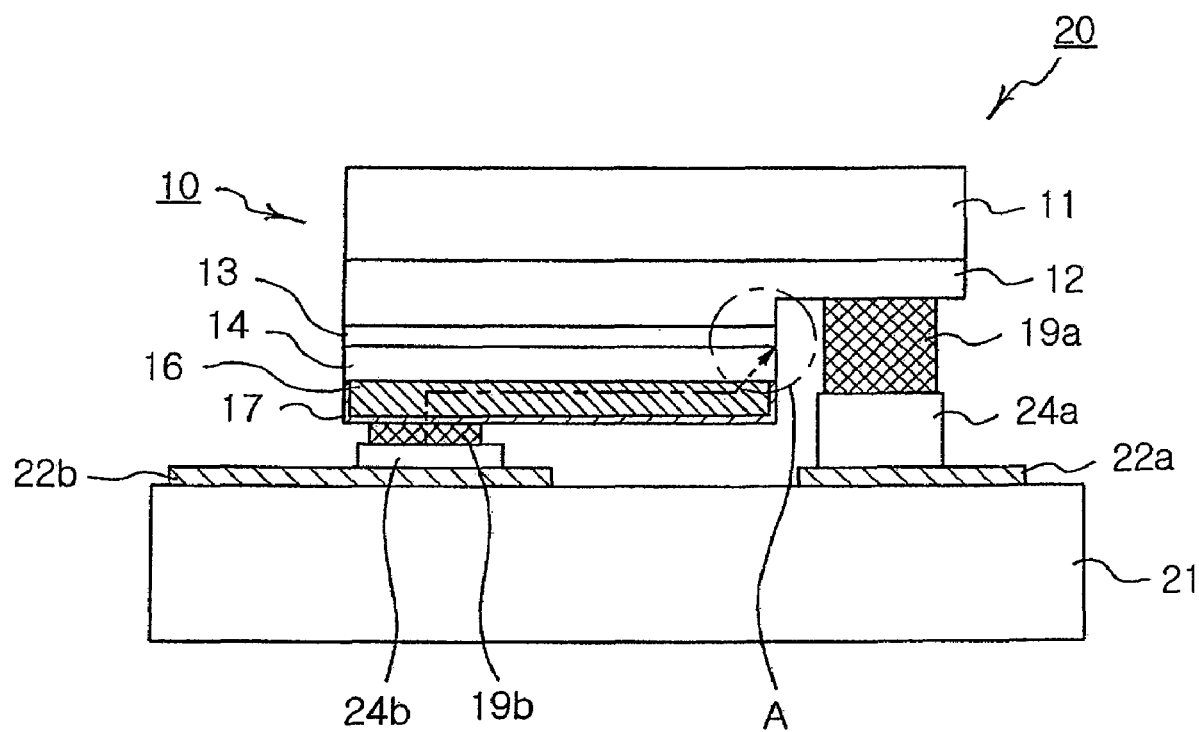
FIG. 1 is a side view, in section, showing a conventional flip chip-type nitride light emitting diode.

A detailed description of components of a nitride semiconductor light emitting diode according to the present invention will be given hereinafter.

p-Type and n-Type Nitride Semiconductor Layers

The p-type and n-type nitride semiconductor layers are single crystals each having the following formula: $Al_xIn_yGa_{(1-x-y)}N$ (where, $0 \leq x \leq 1$, $0 \leq y \leq 1$, and $0 \leq x+y \leq 1$), and are grown by means of Metal Organic Chemical Vapor Deposition (MOCVD), Molecular Beam Epitaxy (MBE), or Hydride Vapor Phase Epitaxy (HVPE). The typical nitride semiconductor layers include GaN, AlGaN, and GaInN.

The P-type nitride semiconductor layer may contain impurities, such as Mg, Zn, and Be. The n-type nitride semiconductor layer may contain impurities, such as Si, Ge, Se, Te, and C. Between the substrate and the nitride semiconductor layer is usually disposed a buffer layer for lattice matching. The common buffer layer may be a low-temperature core growth layer, such as AlN or GaN.

Active Layer

The active layer adopted in the present invention is a layer for emitting blue-green light (having a wavelength of approximately 350 to 550 nm). The active layer comprises an undoped nitride semiconductor layer having a single or multiple quantum well structure. The active layer may be grown by means of Metal Organic Chemical Vapor Deposition (MOCVD), Molecular Beam Epitaxy (MBE), or Hydride Vapor Phase Epitaxy (HVPE), as in the p-type and n-type nitride semiconductor layer.

Mesh-Type DBR Reflecting Layer

The present invention comprises a mesh-type DBR reflecting layer. The mesh-type DBR reflecting layer adopted in the present invention is composed of two kinds of nitride layers having different Al content, which are alternately stacked several times. Generally, a refractive index of the nitride may vary depending upon the Al content. For this reason, a DBR structure having high reflexibility may be formed. When the difference between the refractive index of one of the nitride layers and the refractive index of the other nitride layer, both of which constitute the mesh-type DBR reflecting layer, is great, the thickness of the layer may be decreased, and the number of times at which the layers are stacked is decreased. Consequently, the mesh-type DBR reflecting layer is preferably composed of two kinds of nitride layers having different Al content, difference of which is at least 30%. Generally, the mesh-type DBR reflecting layer is designed to obtain high reflexibility of 90% or more, preferably 95% or more, and more preferably 98% or more.

The DBR reflecting layer of the present invention is formed in the shape of a mesh. Consequently, an ohmic contact layer, which will be formed in a subsequent process, contacts the p-type nitride semiconductor layer through a plurality of open regions arranged over the mesh-type DBR reflecting layer. The DBR reflecting layer, which is made of nitrides, has resistance higher than that of the ohmic contact layer. As a result, electric current flowing to the active layer through the ohmic contact layer is uniformly diffused by means of the mesh-type DBR reflecting layer. Consequently, current crowding is mitigated.

Preferably, the mesh-type DBR reflecting layer is formed of a three component-based nitride satisfying the following formula: $Al_{1-x}Ga_xN$ ($0 \leq x \leq 1$) to easily adjust the Al content. More preferably, the mesh-type DBR reflecting layer is formed of a first nitride layer, such ah GaN, and a second nitride layer, such as $Al_{1-x}Ga_xN$ ($0 \leq x \leq 1$), which are alternately stacked several times.

The nitride layers constituting the mesh-type DBR reflecting layer may be formed successively through the use of the same growth process as the p-type and n-type nitride semiconductor layers and the active layer, i.e., through the use of Metal Organic Chemical Vapor Deposition (MOCVD), Molecular Beam Epitaxy (MBE), or Hydride Vapor Phase Epitaxy (HVPE). Subsequently, the nitride layers are selectively etched by means of a photolithographic process to obtain the desired mesh-type DBR reflecting layer.

Ohmic Contact Layer

As described above, the ohmic contact layer adopted in the present invention is formed on the mesh-type DBR reflecting layer and the p-type nitride semiconductor layer exposed through the open regions of the mesh-type DBR reflecting layer. Electric current flowing to the active layer though the ohmic contact layer having high reflexibility is uniformly diffused over the entire surface of the p-type nitride semiconductor layer by means of the mesh-type DBR reflecting layer having high resistance. As a result, current crowding is mitigated.

It is required that the ohmic contact layer having high reflexibility be formed of high reflexibility sufficient to lower contact resistance between the p-type nitride semiconductor layer having a relatively high energy band gap.

In order to decrease the contact resistance and to increase the reflexibility, the ohmic contact layer having high reflexibility may be formed of a material selected from the group consisting of Ag, Ni, Al, Ph, Pd, Ir, Ru, Mg, Zn, Pt, Au, and composites thereof. Preferably, the ohmic contact layer has reflexibility of 70% or more. Specifically, the ohmic contact layer may be formed of Ni/Ag, Zn/Ag, Ni/Al, Zn/Al, Pd/Ag, Pd/Al, Ir/Ag, Ir/Au, Pt/Ag, Pt/Al, or Ni/Ag/Pt.

The ohmic contact layer is formed by means of an ordinary deposition or sputtering process. The ohmic contact layer may be thermally treated at the temperature of approximately 400° C. to 900° C. to improve the characteristics of the ohmic contact layer.

Metal Barrier Layer

The metal barrier layer adopted in the present invention is formed at the ohmic contact layer having high reflexibility where a p-side bonding electrode is to be formed. The metal barrier layer is disposed at the interface between the bonding electrode material and the ohmic contact layer material for preventing deterioration of the characteristics (especially, reflexibility and contact resistance) of the ohmic contact layer. The metal barrier layer may be constructed in a single-layered structure or a multiple-layered structure. The metal barrier layer may be made of a material selected from the group consisting of Ni, Al, Cu, Cr, Ti, and composites thereof.

The metal barrier layer may extend to the sides of the ohmic contact layer having high reflexibility. In this case, it is possible to effectively prevent occurrence of current leakage due to migration of Ag when the ohmic contact layer having high reflexibility contains Ag.

The metal barrier layer is formed by means of an ordinary deposition or sputtering process, as in the above-described electrodes. The metal barrier layer may be thermally treated at a temperature of approximately 300° C. for several tens of seconds or several minutes to improve adherence.

P-Side Bonding Electrode and n-Side Electrode

The p-side bonding electrode, which constitutes the p-side electrode structure together with the ohmic contact layer and the metal barrier layer, is an uppermost electrode layer to be mounted on a lead through a conductive bump in the flip chip structure. Generally, the p-side bonding electrode is made of Au or an alloy containing Au.

The n-side electrode formed on the n-type nitride semiconductor layer may be constructed in a single-layered structure or a multiple-layered structure. The n-side electrode may be made of a material selected from the group consisting of Ti, Cr, Al, Cu, and Au.

The electrodes are formed by means of an ordinary metal layer growth process, such as deposition or a sputtering process.

Now, preferred embodiments of the present invention will be described in detail with reference to the accompanying drawings.

Figure 2A:
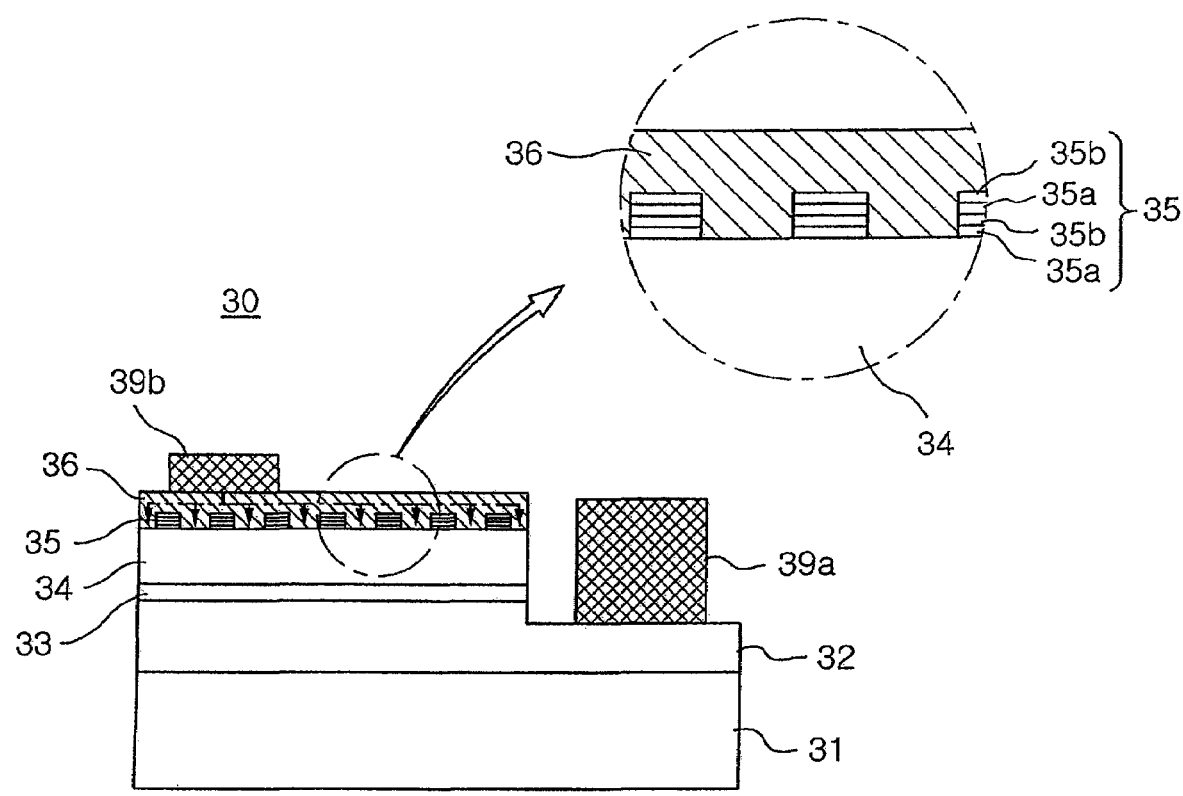
FIG. 2A is a side view, in section, showing a flip chip-type nitride semiconductor light emitting diode according to a preferred embodiment of the present invention.
Figure 2B:
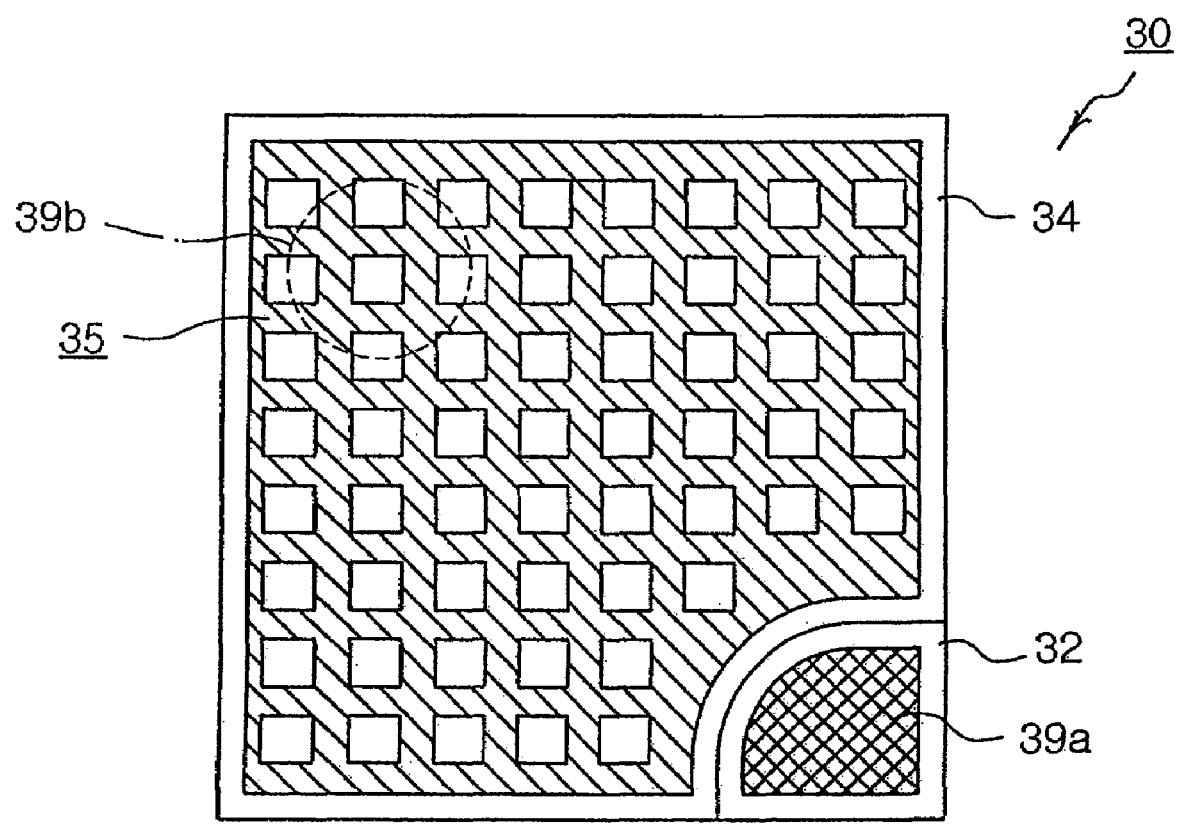
FIG. 2B is a plan view of the flip chip-type nitride semiconductor light emitting diode according to the preferred embodiment of the present invention show in FIG. 2A.

FIG. 2A is a side view, in section, showing a flip chip-type nitride semiconductor light emitting diode 30 according to a preferred embodiment of the present invention, and FIG. 2B is a plan view of the flip chip-type nitride semiconductor light emitting diode 30 according to the preferred embodiment of the present invention show in FIG. 2A.

Referring to FIG. 2A, the flip chip-type nitride semiconductor light emitting diode 30 comprises a nitride semiconductor growth substrate 31, such as a sapphire substrate, an n-type nitride semiconductor layer 32 disposed on the nitride semiconductor growth substrate 31, an active layer 33 disposed on the n-type nitride semiconductor layer 32, and a p-type nitride semiconductor layer 34 disposed on the active layer 33.

The nitride semiconductor light emitting diode 30 has an n-side electrode 39a formed on the upper surface of the n-type nitride semiconductor layer 32, which is exposed by means of mesa etching. A p-side electrode structure adopted in the nitride semiconductor light emitting diode 30 includes a mesh-type DBR reflecting layer 35, an ohmic contact layer 36, and a bonding electrode 39b. The ohmic contact layer 36 is formed on the p-type nitride semiconductor layer 34. The ohmic contact layer 36 is constructed in a mesh structure having a plurality of open regions, by which the p-type nitride semiconductor layer 34 is partially exposed. The bonding electrode 39b is formed on the upper surface of the ohmic contact layer 35.

The mesh-type DBR reflecting layer 35 comprises first and second nitride layers 35a and 35b having different Al content, which are alternately stacked several times. Preferably, difference of the Al content between the first and second nitride layers 35a and 35b is at least 30% to sufficiently ensure difference between the refractive indices of the first and second nitride layers 35a and 35b. For example, the mesh-type DBR reflecting layer 35 may be an AlGaN-based nitride layer. In a preferred embodiment of the present invention, the first nitride layer 35a is GaN, and the second nitride layer 35b is AlGaN. In this case, the mesh-type DBR reflecting layer 35 has high reflexibility. Also, the mesh-type DBR reflecting layer 35 maintains stable reflexibility at high temperature, unlike the ohmic contact material having high reflexibility, such as Ag or Al. Consequently, the total reflexibility is prevented from being deteriorated by the area of the mesh-type DBR reflecting layer 35 even when the temperature is high.

The first and second nitride layers 35a and 35b are undoped crystal layers. Alternatively each of the first and second nitride layers 35a and 35b may be manufactured as an amorphous layer. In a specific embodiment of the present invention, it is necessary that one of the first and second nitride layers 35a and 35b have high content of Al to ensure sufficient refractive index. In the nitride having high Al content, however, a crack may occur at an ordinary crystal growth temperature (more than 1000° C.). Consequently, it is preferable to grow the mesh-type DBR reflecting layer 35 at a temperature of 500° C. to 700° C.

As shown in FIG. 2B, the mesh-type DBR reflecting layer 35 has a plurality of open regions, which are arranged in the mesh structure. The ohmic contact layer 36 formed on the mesh-type DBR reflecting layer 35 contacts the p-type nitride semiconductor layer 34 through the open regions of the mesh-type DBR reflecting layer 35 to form ohmic contact. The mesh-type DBR reflecting layer 35 has resistance higher than that of the ohmic contact layer 36. Consequently, electric current flowing from the p-side bonding electrode 39b to the n-side electrode 39a through the ohmic contact layer 36 is uniformly diffused by means of the mesh structure of the mesh-type DBR reflecting layer, as indicated by the arrow in FIG. 2A.

It is preferable to increase the effective area of the mesh-type DBR reflecting layer 35 (i.e., the area of the mesh-type DBR reflecting layer 35 excluding the open regions of the mesh-type DBR reflecting layer 35), since brightness is increased by virtue of high reflexibility. It is necessary, however, that sufficient contact area be provided between the p-type nitride semiconductor layer 34 and the ohmic contact layer 36. Preferably, the effective area of the mesh-type DBR reflecting layer 35 is approximately 20% to 60% of the upper surface area of the p-type nitride semiconductor layer 34.

The mesh-type DBR reflecting layer 35 adopted in the present invention is composed of a nitride layer, such as AlGaN. Consequently, the mesh-type DBR reflecting layer 35 can be successively formed by means of the same growth process as the p-type and n-type nitride semiconductor layers 34 and 32 and the active layer 33. For example, when the mesh-type DBR reflecting layer 35 is composed of a first nitride layer 36a, such as GaN, and a second nitride layer 36b, such as AlGaN, the mesh-type DBR reflecting layer 35 can be manufactured using trimethylgallium (TMG), trimethylaluminum (TMA), and ammonia ($NH_4$) as a source gas under conditions similar to the single crystal growth process of the nitride in a MOCVD chamber where a single crystal growth process for a light emitting structure is carried out. As described above, the mesh-type DBR reflecting layer 35 is not limited to the single crystal. When Al content of the mesh-type DBR reflecting layer 35 is high, the mesh-type DBR reflecting layer 35 is preferably manufactured in the shape of an amorphous layer, which is grown at low temperature. In this case, the mesh-type DBR reflecting layer 35 can be grown at a temperature lower than the single crystal growing temperature, for example, 500° C. to 700° C.

Figure 3:
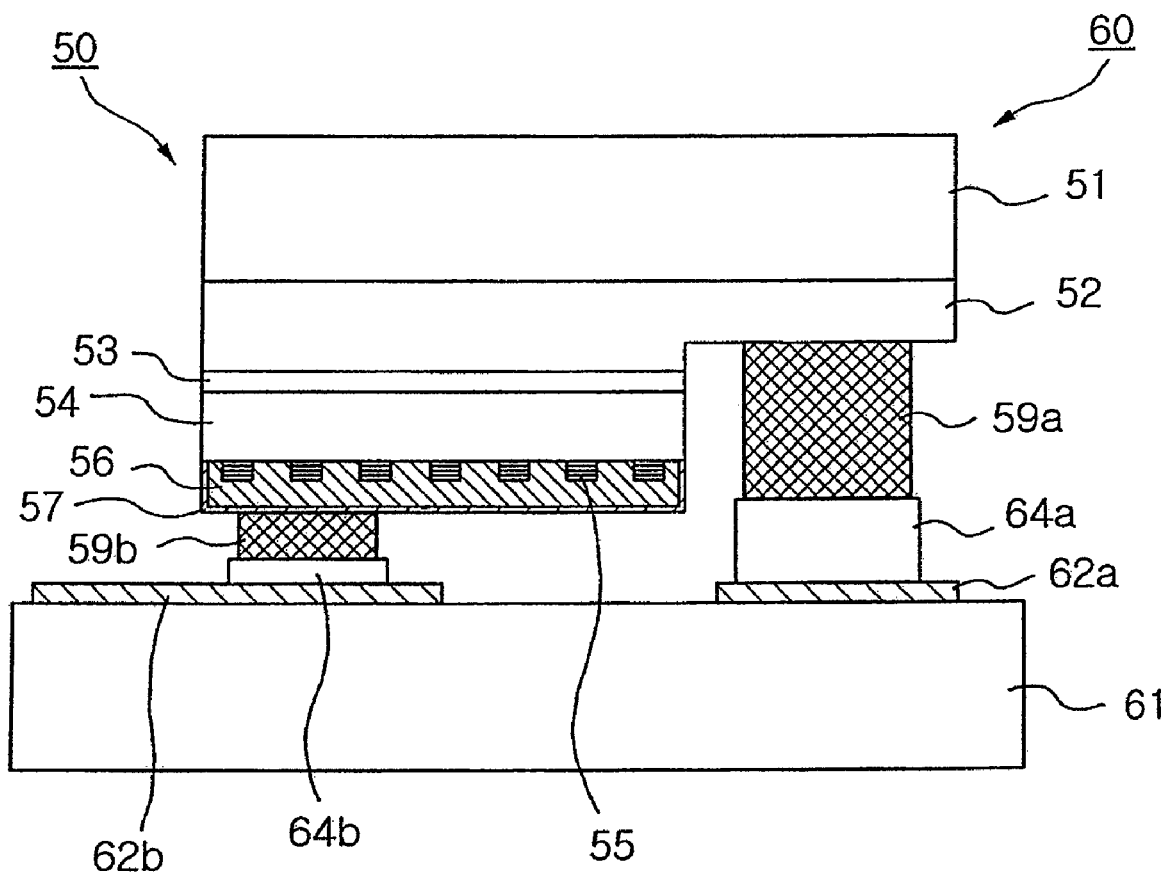
FIG. 3 is a side view, in section, showing a flip chip-type nitride light emitting diode according to another preferred embodiment of the present invention.

FIG. 3 is a side view, in section, showing a flip chip-type light emitting device 60 according to another preferred embodiment of the present invention.

As shown in FIG. 3, the flip chip-type light emitting device 60 comprises a chip substrate 61 and a nitride light emitting diode 50 disposed on the chip substrate 61. The nitride semiconductor light emitting diode 50 comprises a nitride semiconductor growth substrate 51, such as a sapphire substrate, an n-type nitride semiconductor layer 52 disposed on the nitride semiconductor growth substrate 51, an active layer 53 disposed on the n-type nitride semiconductor layer 52, and a p-type nitride semiconductor layer 54 disposed on the active layer 53. The nitride semiconductor light emitting diode 50 is mounted on the chip substrate 61 such that electrodes 69a and 69b are connected to lead patterns 62a and 62b via conductive bumps 64a and 64b, respectively.

The nitride semiconductor light emitting diode 50 has an n-side electrode 59a formed on the upper surface of the n-type nitride semiconductor layer 52, which is exposed by means of mesa etching. A p-side electrode structure adopted in the nitride semiconductor light emitting diode 50 includes a mesh-type DBR reflecting layer 55, an ohmic contact layer 56, and a bonding electrode 59b, which are similar to those shown in FIG. 2A. In addition, a metal barrier layer 57 is formed on the surface of the ohmic contact layer 56 such that the metal barrier layer 57 surrounds both sides of the ohmic contact layer 56. The metal barrier layer 57 serves to prevent immigration of the material of the ohmic contact layer 56, such as Al, and mixture of Au component at the interface between the p-side bonding electrode 59b and the ohmic contact layer 56.

As described above, the sapphire substrate 51 of the light emitting diode 50 in the flip chip-type light emitting device is a light transmittance substrate. Consequently, the sapphire substrate 51 serves as a light emitting surface of the flip chip-type light emitting device 60. In this structure, the mesh-type DBR reflecting layer 55 and the ohmic contact layer 56 serve as reflecting layers at the opposite side so that the amount of the emitted light can be increased. Especially, the mesh-type DBR reflecting layer 55 has high reflexibility of 90% or more. Also, the mesh-type DBR reflecting layer 55 maintains stable reflexibility at high temperature. Consequently, reflecting performance of the mesh-type DBR reflecting layer 55 is improved. Moreover, the mesh-type DBR reflecting layer 55 diffuses electric current provided though the ohmic contact layer 56, whereby current crowding is mitigated.

As apparent from the above description, the present invention provides a nitride semiconductor light emitting diode having an improved p-side electrode structure where a mesh-type DBR reflecting layer is composed of two kinds of nitride layers having different Al content to decrease electric current concentrated to the region adjacent to an n-side electrode. Consequently, the present invention has the effect of mitigating current crowding and increasing reflexibility, and therefore improving overall light emitting efficiency. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a nitride semiconductor light emitting diode, the method comprising the steps of:

preparing a light transmittance substrate that allows a nitride semiconductor to be grown thereon;

forming an n-type nitride semiconductor layer on the light transmittance substrate;

forming an active layer on the n-type nitride semiconductor layer;

forming a p-type nitride semiconductor layer on the active layer;

alternately stacking first and second nitride layers having different Al content on the p-type nitride semiconductor layer several times to form a mesh-type DBR reflecting layer having a plurality of open regions; and forming an ohmic contact layer directly over the mesh-type (Distributed Bragg) DBR reflecting layer and the p-type nitride semiconductor layer exposed through the open regions of the mesh-type DBR reflecting layer;

wherein the step of forming the n-type nitride semiconductor layer, the step of forming the active layer, the step of forming the p-type layer, and the step of forming the mesh-type DBR reflecting layer are carried out successively in the same chamber.

2. The method as set forth in claim 1, wherein the step of forming the mesh-type DBR reflecting layer comprises alternately stacking the first and second nitride layers having Al content different from each other by at least 30% several times.

3. The method as set forth in claim 1, wherein the first and second nitride layers constituting the mesh-type DBR reflecting layer are formed of materials satisfying the following formula $$Al_{1-x}Ga_xN\ (0 \leqq x \leqq 1).$$

4. The method as set forth in claim 1, wherein the step of forming the mesh-type DBR reflecting layer comprises alternately stacking the first nitride layers made of AlGaN and the second nitride layers made of GaN several times.

5. The method as set forth in claim 1, wherein the area of the mesh-type DBR reflecting layer is approximately 20% to 60% of the upper surface area of the p-type nitride semiconductor layer.

6. The method as set forth in claim 1, wherein the step of forming the mesh-type DBR reflecting layer is carried out at a temperature of 500° C. to 700° C.

7. The method as set forth in claim 1, wherein the ohmic contact layer comprises at least one layer made of a material selected from the group consisting of Ag, Ni, Al, Ph, Pd, Ir, Ru, Mg, Zn, Pt, Au, and composites thereof.

8. The method as set forth in claim 1, further comprising the step of:

forming a metal barrier layer on the surface of the ohmic contact layer.

9. The method as set forth in claim 8, wherein the metal barrier layer comprises at least one layer made of a material selected from the group consisting of Ni, Al, Cu, Cr, Ti, and composites thereof.

* * * * *